United States Patent
Rijssemus

(10) Patent No.: US 9,209,774 B2
(45) Date of Patent: Dec. 8, 2015

(54) SIGNAL SPLITTER FOR USE IN MOCA/CATV NETWORKS

(75) Inventor: Martien Rijssemus, Veenendaal (NL)

(73) Assignee: Technetix Group Limited, Burgess Hill (GB)

( * ) Notice: Subject to any disclaimer, the term of this patent is extended or adjusted under 35 U.S.C. 154(b) by 277 days.

(21) Appl. No.: 13/816,023

(22) PCT Filed: Sep. 9, 2011

(86) PCT No.: PCT/GB2011/051698
§ 371 (c)(1),
(2), (4) Date: Mar. 18, 2013

(87) PCT Pub. No.: WO2012/035323
PCT Pub. Date: Mar. 22, 2012

(65) Prior Publication Data
US 2013/0181789 A1    Jul. 18, 2013

(30) Foreign Application Priority Data
Sep. 14, 2010 (GB) .................................. 1015295.7

(51) Int. Cl.
| | |
|---|---|
| H03H 7/38 | (2006.01) |
| H03H 7/42 | (2006.01) |
| H03H 7/48 | (2006.01) |
| H04N 7/10 | (2006.01) |
| H03H 7/06 | (2006.01) |
| H03H 7/01 | (2006.01) |

(52) U.S. Cl.
CPC ................. *H03H 7/42* (2013.01); *H03H 7/482* (2013.01); *H04N 7/104* (2013.01); *H03H 7/06* (2013.01); *H03H 7/1791* (2013.01)

(58) Field of Classification Search
CPC ........... H03H 7/42; H03H 7/485; H03H 7/06; H03H 7/1791; H04N 7/104
USPC ...................................... 333/131, 124, 25, 26
See application file for complete search history.

(56) References Cited

U.S. PATENT DOCUMENTS

| | | | |
|---|---|---|---|
| 3,146,409 A | 8/1964 | Lalmond | |
| 6,578,202 B1 | 6/2003 | Holland | |
| 8,350,641 B2 * | 1/2013 | Alkan et al. | ................. 333/126 |
| 8,752,114 B1 * | 6/2014 | Shapson et al. | ................ 725/127 |

FOREIGN PATENT DOCUMENTS

| | | |
|---|---|---|
| WO | WO 2010/126472 | 11/2010 |
| WO | WO 2010/133884 | 11/2010 |

* cited by examiner

*Primary Examiner* — Robert Pascal
*Assistant Examiner* — Kimberly Glenn
(74) *Attorney, Agent, or Firm* — DASCENZO Intellectual Property Law, P.C.

(57) ABSTRACT

There is provided a splitter circuit means for use with a CATV network comprising a signal input (34) in communication with a transformer or balun (32) to supply two signal outputs (36, 38), with a resistor (52) connected in parallel between the outputs (36, 38) and wherein additional capacitive, inductive and resistive elements (48, 50, 52, 54) are associated with the resistor (42), thereby to give an insertion loss in to out in the range of 3 to 10 dB and isolation 10 out to out of <17 dB for signal frequencies in the range 1125 MHz to 1700 MHz, while at the same time maintaining good RF performance in the frequency range 5 MHz to 1000 MHz.

18 Claims, 2 Drawing Sheets

SIGNAL SPLITTER FOR USE IN MOCA/CATV NETWORKS

FIELD OF THE INVENTION

This invention relates to a signal splitter for use in MoCA/CATV networks, the associated circuitry and a cable television network incorporating such signal splitters.

BACKGROUND TO THE INVENTION

A signal splitter, also known as a power splitter, for use in networks where CATV (cable television) transmission is combined with MoCA (Multimedia over Coax Alliance) transmission should have good return loss, low insertion loss and high isolation in the CATV frequency range (typically 5 MHz to 1000 MHz) to give excellent RF performance.

However for the MoCA frequency range which in the future is expected to range from is typically 1125 MHz to 1700 MHz, the signal splitter should ideally have a low isolation as well as a low insertion loss so as to reduce transmission loss and thus improve or, in some cases, enable MoCA transmission between output ports of a plurality of splitters within an in-home network.

Most homes have an in-home coaxial network installed to distribute TV signals to various locations. This network can also be used to distribute data or other signals to and from these locations.

With the increasing use of IP (Internet Protocol) and the internet, in-home networking is becoming very important and whilst there may be an access point in the home, it can be difficult to distribute data from this access point to and from various locations in the home. There are several technologies available to achieve this, for example PowerLine, MoCA, wireless, fibre optic, and CAT-5. These technologies all have their weaknesses.

The advantages of using the existing in-home coaxial networks are obvious: no new wires are needed and the coaxial cable is a medium with large bandwidth and very good screening. It is therefore a safe and fast medium and since it is already in place, it is also an economical solution.

However the signal dividers used in existing coaxial networks have a high isolation between output ports making two-way MoCA communication very difficult and in many cases even impossible.

It is an aim of the present invention to provide a signal splitter and associated circuit means to combine suitable RF performance in the CATV frequency range with low isolation in the MoCA frequency range.

SUMMARY OF THE INVENTION

In accordance with one aspect of the present invention, there is provided a splitter circuit means for use with a CATV network comprising a signal input in is communication with a transformer or balun to supply two signal outputs, with a first resistor connected in parallel between the outputs and wherein a filter unit comprising a single inductive element, capacitive and resistive elements is associated with the first resistor, thereby to give an insertion loss in to out in the range of 3 to 10 dB, and preferably an isolation out to out of <17 dB, for signal frequencies in the range 1125 MHz to 1700 MHz. The frequency band of 1125 to 1700 MHz is the preferred MoCA bandwidth and a splitter circuit with a low insertion loss over this frequency range improves MoCA transmission between output ports of associated splitter circuits.

Preferably the filter unit is connected in series with the first resistor thereby to prevent signals flowing through the first resistor for signal frequencies in the range 1125 MHz to 1700 MHz.

Preferably two capacitive elements, a second resistor and an inductive element are connected in parallel with the first resistor. Preferably the two capacitive elements are in series with each other and in parallel with the second resistor and inductive element. A signal splitter incorporating such a circuit will have low isolation, low insertion loss and moderate return loss for signals within the MoCA frequency range.

Desirably the inductive element has an inductance in the range 10 nH to 20 nH, more preferably 3 nH to 11 nH.

The first capacitive element may have a capacitance in the range 2 pF to 5 pF, more preferably in the range 1 pF to 2.5 pF, with the second capacitive element preferably having a capacitance in the range 0.1 pF to 3 pF, more preferably 1 pF to 1.5 pF.

The second resistor may have a resistance in the range 100 to 50 Ohm, more preferably 90 to 75 Ohm, where the first resistor has a value in the range 150 to 50 Ohm, more preferably 110 to 70 Ohm. Typically the narrower range of values applies where the splitter circuit means is incorporated into a two-way splitter, the broader range applying for four-way splitters.

The splitter circuit means preferably has an insertion loss in to out in the range 3 to 6 dB for frequencies in the range 5 to 1000 MHz and an insertion loss in to out of 3 to 10 dB for frequencies in the range 1125 MHz to 1700 MHz. The splitter circuit means preferably has an isolation port to port of >20 dB for frequencies in the range 5 to 1000 MHz and <17 dB in the frequency range 1125 to 1700 MHz. The splitter circuit means thus is able to have suitable RF performance in the CATV frequency range while at the same time having low insertion loss, low isolation and moderate return loss for signals in the MoCA frequency range.

The invention also lies in a signal splitter incorporating at least one splitter circuit means as aforesaid, so giving two output ports which are typically associated with subscriber equipment. In such a signal splitter, the single inductive element may have an inductance in the range 10 nH to 20 nH, the first capacitive element may have a capacitance in the range 2 pF to 5 pF and the second capacitive element may have a capacitance in the range 0.1 pF to 3 pF, with the second resistor preferably having a resistance in the range 100 to 50 Ohm.

The signal splitter may incorporate a plurality of splitter circuit means as aforesaid so as to provide additional output ports. Typically one splitter circuit means in accordance with the invention will be connected to two splitters to provide a four-way splitter in accordance with the invention.

For signal splitters in which splitter circuits are combined to give 4, 6, 8, 10 or more ports, the values for the inductive, capacitive and resistive elements will need to be selected to ensure the desired insertion loss in to out of between 3 to 10 dB and an isolation out to out of <17 dB is achieved in the MoCA frequency range.

In accordance with another aspect of the present invention, there is also provided a cable television network incorporating one or more splitter circuit means or signal splitters as aforesaid.

The invention will now be described, by way of example, with reference to the accompanying drawings in which.

DESCRIPTION

Figure 1:
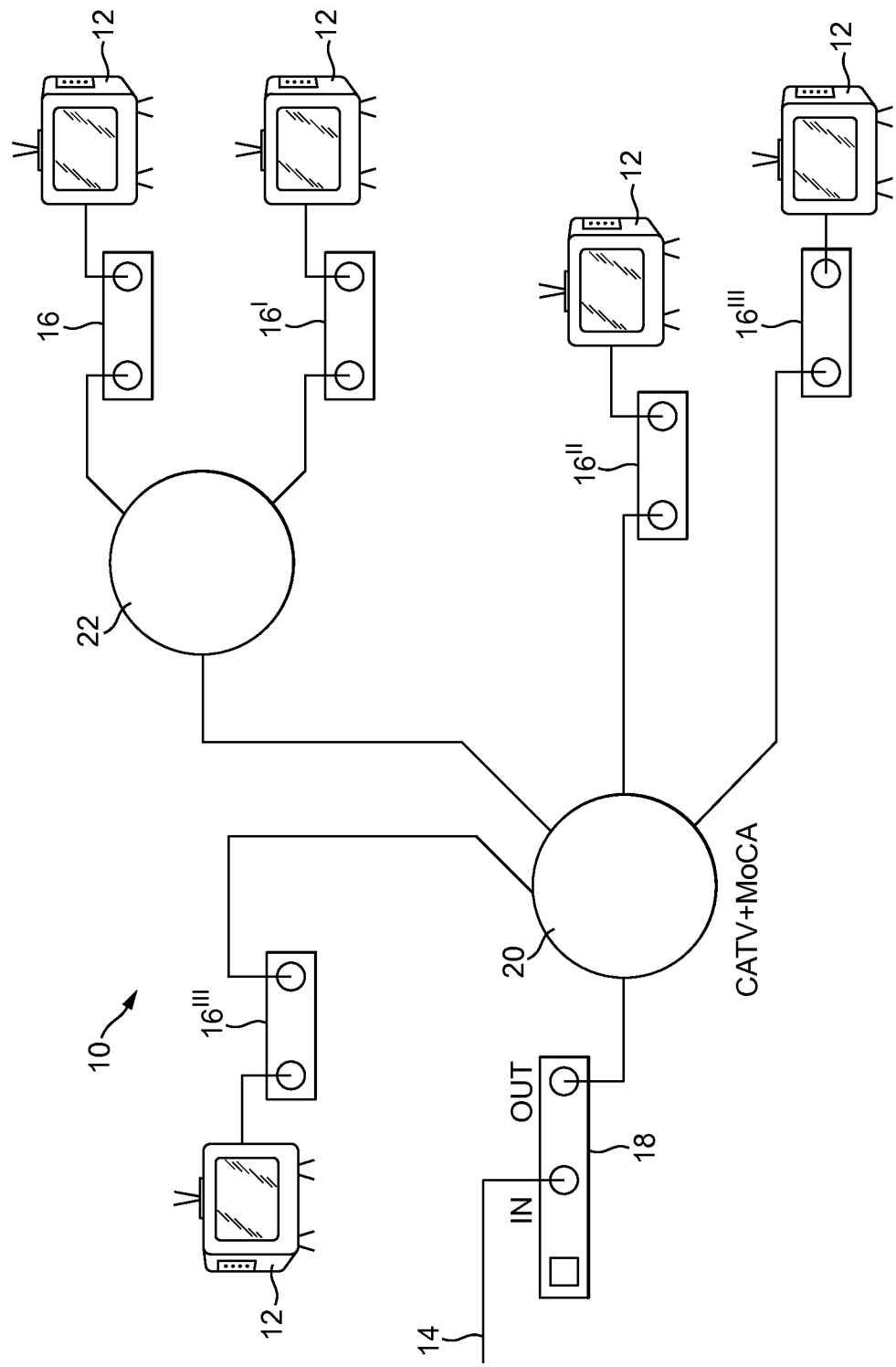
FIG. 1 shows a schematic diagram of an in-home CATV and MoCA network.

A typical in-home CATV+MoCA network configuration 10 is shown in FIG. 1.

Within the home of a subscriber are a number of devices 12, such as televisions which receive a signal from a CATV network 14 and are capable of returning modified signals to the network through set-top boxes 16 which are connected via splitters to a modem 18 which receives and transmits signals to and from the CATV network 14. Within the home, there is typically more than one device receiving the signal from the CATV network and to supply a signal to each item of subscriber equipment, a four-way splitter 20 splits the incoming signal to feed a variety of devices, with if required signals from the four-way splitter being split again, for example by two-way splitter 22. These splitters act to combine the signals returned from the consumer's devices.

The signal or power splitter used in this type of combined CATV/MoCA network should have the normal specification for the CATV frequency range as these channels pass through the modem 18 (from IN to OUT) and are transmitted throughout the in-home network 10.

For transmission in the MoCA frequency range to be achieved, it is necessary to have a lower isolation between the output ports of the power splitters 20, 22 as this will lower the transmission loss. For example: suppose set-top box 16 transmits to set-top box 16'''. The MoCA transmission loss will be:

insertion loss two-way splitter 22+cable losses+isolation of four-way splitter 20

For MoCA transmission from set-top box 16 to set-top box 16' this would be:

cable loss+isolation of two-way splitter 22

For MoCA transmission from modem 18 to set-top box 16 the losses will be:

insertion loss four-way splitter 20+cable losses+insertion loss two-way splitter 22.

Since the frequency of MoCA is high, the cable losses are significant but cannot be avoided. These high cable losses pose yet another problem: the return loss in the MoCA frequency range at the input of the two-way splitter will be on average:

return loss four-way splitter 22+2 times cable loss between two-way 22 and four-way splitter 20

This will increase the isolation between outputs of the two-way splitter 22 and as such increase transmission loss between certain points in the network 10.

Figure 2:
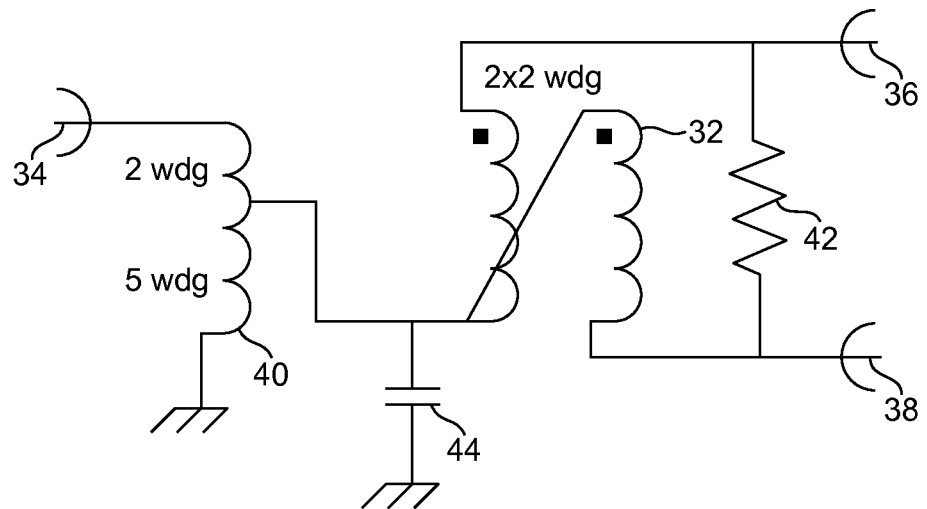
FIG. 2 shows a prior art two-way splitter.

A typical prior art two-way signal divider 30 will have a topology as shown in FIG. 2. This splitter comprises a transformer in the form of a (typical) 2×2 winding 180 degree balun (balanced to unbalance to converter) 32, also known in the art as a 'fork', which splits the signal from an input 34 to provide separate signals to two customer outputs 36, 38. The impedance at the centrepoint of the balun 32 is half of the input impedance 75 Ohm and the impedances of the outputs 36, 38, each again 75 Ohm, and in the case of a cable TV splitter is 37.5 Ohm. A resistor 42 is connected in parallel with the balun 32 and typically has a value of 150 Ohm. Frequency response compensation of the circuit is achieved by means of capacitor 44 which typically has a capacitance of around 2 pF. A step-up transformer 40 split at (typically) 2 windings and 5 windings is placed in series between the input 34 and the balun 32, transferring the 37.5 Ohm impedance (at the centre tap of balun 32) to 75 Ohm at the input.

This kind of divider has good return loss on all ports and high isolation between output ports. This is not suitable for in-home signal transmission when CATV transmission is combined with MoCA transmission in the frequency range up to 1700 MHz as if the transmission loss of MoCA in the in-home network is to be lowered for the MoCA frequency range the following is required:

low isolation between output ports
low insertion loss from in to out
with a moderate return loss being acceptable.

A standard four-way power splitter is created from three standard two-way splitters as basic building blocks, as is known in the art.

Figure 3:
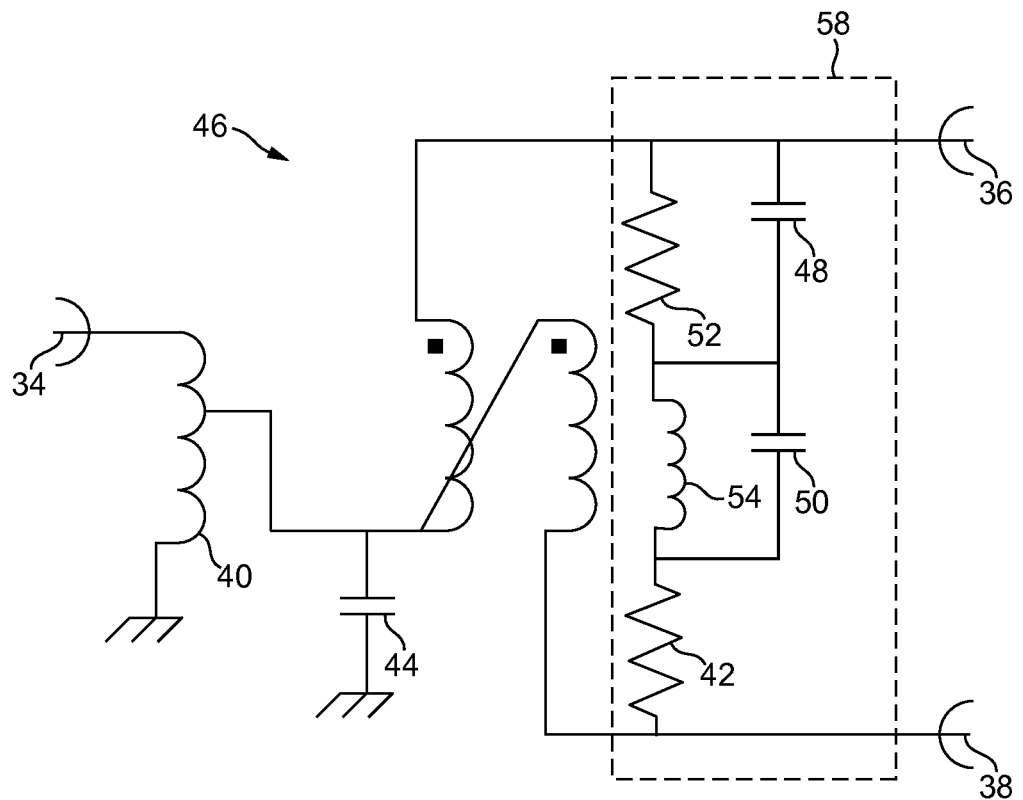
FIG. 3 shows a signal splitter in accordance with the present invention.

FIG. 3 shows a power splitter configuration in accordance with the present invention that does not have the disadvantages of the prior art power splitter shown in FIG. 2 when used in an in-home coaxial network in which CATV transmission and MoCA transmission are combined. In the signal splitter 46 shown in FIG. 3, capacitors 48, 50, resistive element, namely resistor 52, and inductor 54 are added to the resistor feedback circuit in the topology shown.

The resistor 52 is connected in series with inductor 54 and these two elements are in turn in parallel with series capacitors 48 and 50, with a connection between the joining points of capacitors 48, 50 and the joining points of resistor 52 and inductor 54. The filter unit made from the capacitors 48, 50, resistor 52 and inductor 54 is in turn connected to resistor 42, such that resistor 42 is in series with the filter unit. The filter unit prevents signals flowing through the isolating resistor 42 over the frequency range 1125 MHz to 1700 MHz and by blocking this signal path, the isolation of the splitter is greatly reduced.

The feedback circuit 58 acts as a filter with no or little influence at the CATV frequency range from 5 MHz to 1000 MHz but with low insertion loss in the MoCA frequency range from 1125 MHz up to, or even beyond, 1700 MHz. This will lower the isolation in the MoCA frequency range while, at the same time, maintaining low insertion loss, moderate return loss and excellent RF performance in the CATV frequency range 5 MHz to 1000 MHz. Typically for frequencies in the range 1125 MHz to 1700 MHz, the circuit/splitter has an insertion loss in to out in the range 3 to 10 dB, and isolation out to out of <17 dB.

Typical values for the components are:
Resistor 42: 150 to 50 Ohm, more preferably 100 Ohm
Resistor 52: 100 to 50 Ohm, more preferably 82 Ohm
Capacitor 44: depending on the ferrite used and the windings, but typically 1.5 pF to 2.2 pF
Capacitor 48: 1 pF to 2.5 pF, preferably 2.2 pF
Capacitor 50: 1 pF to 1.5 pF
Inductor 54: 3 to 11 nH, typically 1.5 turns of 0.33 mm Cu wire with diameter of 2 mm to 3 mm This circuit is a simple implementation and so can be manufactured using shorter PCB tracks and less PCB surface than more complicated circuits. Using shorter tracks, avoids performance being degraded at higher frequencies such as 1700 MHz. Also, because there is only a single inductor, physical alignment of the value of inductors by bending inductor windings to be more open or closed is easier than if two inductors were used.

The splitter described can be used to make a four-way power splitter or any other multiple splitter from two-way splitters as basic building blocks. The feedback circuit 58 can be used as the basic difference with a standard multiple output CATV splitter.

When using the splitter of FIG. 3, the transmission characteristics in the CATV frequency range are substantially not affected while, at the same time, the transmission loss in the MoCA frequency range improves. This is also true when more power splitters are cascaded as in a larger network or when two-way power splitters are used as basic building blocks in a four-way splitter.

This power splitter has excellent RF performance in the CATV frequency range while at the same time having low isolation, low insertion loss and moderate return loss for the MoCA frequency range up to 1700 MHz.

The invention claimed is:

1. A splitter circuit for use with a CATV network comprising a signal input in communication with a transformer or balun to supply two signal outputs, with a first resistor connected in parallel between the outputs and wherein a filter unit connected in series with the first resistor comprises a single inductive element, two capacitive elements and a second resistor connected in parallel with the first resistor, thereby to give an in-to-out insertion loss in the range of 3 to 10 dB, for signal frequencies in the range 1125 MHz to 1700 MHz.

2. A splitter circuit according to claim 1, wherein the two capacitive elements are in series with each other and in parallel with the second resistor and inductive element.

3. A splitter circuit according to claim 1, wherein the single inductive element has an inductance in the range 10 to 20 nH.

4. A splitter circuit according to claim 1, wherein the first capacitive element has a capacitance in the range 2 pF to 5 pF with the second capacitive element having a capacitance in the range 0.1 pF to 3 pF.

5. A splitter circuit according to claim 1, wherein the second resistor has a resistance in the range 100 to 50 Ohm.

6. A splitter circuit according to claim 1, wherein the splitter circuit has an in-to-out insertion loss in the range 3 to 6 dB for signal frequencies in the range 5 MHz to 1000 MHz.

7. A splitter circuit according to claim 1, having an isolation out to out of <17 dB for frequencies in the range 1125 MHz to 1700 MHz.

8. A signal splitter incorporating at least one splitter circuit according to claim 1.

9. A cable television network incorporating one or more splitter circuit according to claim 1.

10. A splitter circuit for use with a CATV network comprising a signal input in communication with a transformer or balun to supply two signal outputs, with a first resistor connected in parallel between the outputs and a filter unit connected in series with the first resistor, wherein the filter unit comprises a single inductive element, two capacitive elements, and a second resistor, wherein the single inductive element is in parallel with a first capacitive element of the two capacitive elements and the second resistor is in parallel with a second capacitive element of the two capacitive elements, thereby to give an in-to-out insertion loss in the range of 3 to 10 dB, for signal frequencies in the range 1125 MHz to 1700 MHz.

11. A splitter circuit according to claim 10, wherein the two capacitive elements are in series with each other.

12. A splitter circuit according to claim 10, wherein the single inductive element has an inductance in the range 10 to 20 nH.

13. A splitter circuit according to claim 10, wherein the first capacitive element has a capacitance in the range 0.1 pF to 3 pF and the second capacitive element has a capacitance in the range 2 pF to 5 pF.

14. A splitter circuit according to claim 10, wherein the second resistor has a resistance in the range 100 to 50 Ohm.

15. A splitter circuit according to claim 10, wherein the splitter circuit has an in-to-out insertion loss in the range 3 to 6 dB for signal frequencies in the range 5 MHz to 1000 MHz.

16. A splitter circuit according to claim 10, having an isolation out to out of <17 dB for frequencies in the range 1125 MHz to 1700 MHz.

17. A signal splitter incorporating at least one splitter circuit according to claim 10.

18. A cable television network incorporating one or more splitter circuit according to claim 10.

* * * * *